United States Patent
Yeh et al.

(10) Patent No.: US 8,460,856 B2
(45) Date of Patent: Jun. 11, 2013

(54) MATERIAL AND METHOD FOR PHOTOLITHOGRAPHY

(75) Inventors: Hsiao-Wei Yeh, Jhudong Township, Hsinchu County (TW); Jen-Chieh Shih, Jhubei (TW); Jian-Hong Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/238,335

(22) Filed: Sep. 21, 2011

(65) Prior Publication Data

US 2012/0009524 A1  Jan. 12, 2012

Related U.S. Application Data

(62) Division of application No. 11/748,322, filed on May 14, 2007, now Pat. No. 8,029,969.

(51) Int. Cl.
*G03F 7/20* (2006.01)
*G03F 7/30* (2006.01)
*G03F 7/38* (2006.01)
*G03F 7/09* (2006.01)

(52) U.S. Cl.
USPC ............ 430/311; 430/271.1; 430/272.1; 430/325; 430/326; 430/327; 430/330; 430/907; 430/910

(58) Field of Classification Search
None
See application file for complete search history.

(56) References Cited

U.S. PATENT DOCUMENTS

| | | | |
|---|---|---|---|
| 6,669,995 B1 * | 12/2003 | Insalaco et al. | 427/558 |
| 6,953,649 B2 | 10/2005 | Prat et al. | |
| 2005/0089800 A1 | 4/2005 | Lee | |
| 2005/0147920 A1 * | 7/2005 | Lin et al. | 430/311 |
| 2006/0246373 A1 * | 11/2006 | Wang | 430/270.1 |
| 2006/0292490 A1 * | 12/2006 | Kodama et al. | 430/270.1 |
| 2007/0099114 A1 | 5/2007 | Watanabe et al. | |
| 2007/0172761 A1 | 7/2007 | Takahashi et al. | |

OTHER PUBLICATIONS

Chinese Patent Office, Office Action dated Apr. 15, 2010, Application No. 200710187758.0, 6 pages.
Buck, Elke, et al., "Surface-Induced Microphase Separation in Spin-Cast Ultrathin Diblock Copolymer Films on Silicon Substrate Before and After Annealing," Macromolecules 2001, 34, pp. 2172-2178.

* cited by examiner

*Primary Examiner* — Sin J. Lee
(74) *Attorney, Agent, or Firm* — Haynes and Boone, LLP

(57) ABSTRACT

A photosensitive material for use in semiconductor manufacture comprises a copolymer that includes a plurality of photoresist chains and a plurality of hydrophobic chains, each hydrophobic chain attached to the end of one of the photoresist chains. The copolymer in response to externally applied energy will self-assemble to a photoresist layer and a hydrophobic layer.

18 Claims, 5 Drawing Sheets

MATERIAL AND METHOD FOR PHOTOLITHOGRAPHY

This application is a divisional of U.S. patent application Ser. No. 11/748,322, filed May 14, 2007, the content of which is incorporated herein by reference in its entirety.

BACKGROUND

The present disclosure relates generally to the manufacturing of semiconductor devices, and more particularly to a self-assembled photosensitive layer that may be used in immersion lithography.

As semiconductor fabrication technologies are continually progressing to smaller feature sizes such as 65 nanometers, 45 nanometers, and below, immersion lithography methods are being adopted. However, during an exposure process using an immersion lithography system, contaminations such as particles and water residues can be introduced into the immersion lithography system and further contaminate semiconductor wafers to be processed therein. For example, leaching of photoresist materials into the immersion fluid may cause such contaminations. Accordingly, the contaminations can cause defects and yield degradation.

One method for reducing such contamination is to provide a topcoat layer directly over the photoresist. The topcoat layer provides a barrier to prevent diffusion of photoresist material into the immersion fluid. However, such a method possesses a number of shortcomings. First, the costs and time associated with forming the topcoat layer are extensive. Second, the topcoat layer may adversely affect the lithography process due to its refractive index, thickness, and chemical makeup. Therefore, what is need is a simple and cost-effective material and method for an improved photosensitive layer for use in immersion lithography.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
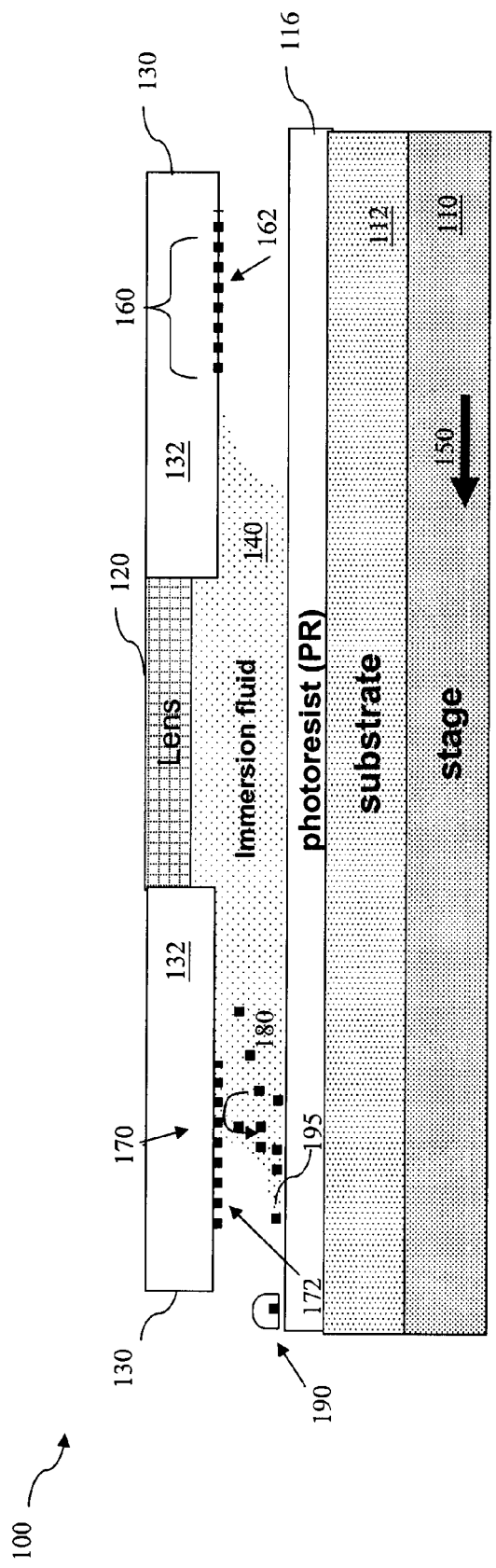
FIG. 1 is a schematic view of an immersion lithography system and contaminations being introduced into the immersion lithography system.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a schematic view of an immersion lithography system 100. The system 100 includes a substrate table 110 to hold a substrate 112 for processing by the system 100. The substrate table 110 can be a substrate stage or include a substrate stage as a part thereof. The substrate table 110 may be operable to secure and move the substrate 112 relative to the system 100. For example, the substrate table 110 may be designed to be capable of translational and/or rotational displacement for substrate alignment, stepping, and scanning. The substrate table 110 may include various components suitable to perform precise movement.

The substrate 112 to be held by the substrate table 110 and processed by the system 100 may be a semiconductor wafer such as a silicon wafer. Alternatively, the semiconductor wafer may include an elementary semiconductor, a compound semiconductor, an alloy semiconductor, or combinations thereof. For example, the substrate 112 may include an elementary semiconductor, such as crystal silicon, polycrystalline silicon, amorphous silicon, and/or germanium; a compound semiconductor, such as silicon carbide and/or gallium arsenic; an alloy semiconductor, such as SiGe, GaAsP, AlInAs, AlGaAs, and/or GaInP. Furthermore, the substrate 112 may include a bulk semiconductor, such as bulk silicon, and such a bulk semiconductor may include an epi silicon layer. The substrate 112 may also include a semiconductor-on-insulator substrate, such as a silicon-on-insulator (SOI) substrate, or a thin-film transistor (TFT) substrate. Additionally, the substrate 112 may include one or more material layers such as poly-silicon, metal, and/or dielectric, to be patterned. The substrate 112 may further include an imaging layer 116 formed thereon. The imaging layer 116 can be a photoresist layer (resist layer, photosensitive layer, patterning layer) that is responsive to an exposure process for creating patterns. The imaging layer 116 may be a positive or negative type resist material and may have a multi-layer structure. One exemplary resist material is a chemical amplifier (CA) resist.

The immersion lithography system 100 includes one or more imaging lens systems (referred to as a "lens system") 120. The semiconductor wafer may be positioned on a substrate table 110 under the lens system 120. The lens system 120 may further include or be integral to an illumination system (e.g., a condenser) which may have a single lens or multiple lenses and/or other lens components. For example, the illumination system may include microlens arrays, shadow masks, and/or other structures. The lens system 120 may further include an objective lens which may have a single lens element or a plurality of lens elements. Each lens element may include a transparent substrate and may further include a plurality of coating layers. The transparent substrate may be a conventional objective lens, and may be made of fused silica (SiO2), calcium-fluoride (CaF2), lithium fluoride (LiF), barium fluoride (BaF2), or other suitable material. The materials used for each lens element may be chosen based on the wavelength of light used in the lithography process to minimize absorption and scattering.

The system 100 includes an immersion fluid retaining module 130 for holding a fluid 132 such as an immersion fluid. The immersion fluid retaining module 130 may be positioned proximate (such as around) the lens system 120 and designed for other functions, in addition to holding the immersion fluid. The immersion fluid retaining module 130 and the lens system 120 make up (at least in part) an immersion head or hood. The immersion fluid may include water (water solution or de-ionized water-DIW), high n fluid (n is index of refraction), gas, or other suitable fluid.

The immersion fluid retaining module 130 may include various apertures (or nozzles) for providing the immersion fluid for an exposure process. Particularly, the module 130 may include an immersion fluid inlet to provide and transfer the immersion fluid into a space 140 between the lens system 120 and the substrate 112 on the substrate table 110. The module 130 may also include an immersion fluid outlet to remove and transfer the immersion fluid from the space 140. It is understood that the immersion fluid may be provided to and from the space 140 at a sufficient rate by components suitable for this type of movement.

The immersion lithography system 100 may further include a radiation source (not shown). The radiation source may be a suitable ultraviolet (UV) or extra UV (EUV) light source. For example, the radiation source may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride (F2) excimer laser with a wavelength of 157 nm; or other light sources having a desired wavelength (e.g., below approximately 100 nm).

A photomask (also referred to as a mask or a reticle) may be introduced into the system 100 during an immersion lithography process. The mask may include a transparent substrate and a patterned absorption layer. The transparent substrate may use fused silica (SiO2) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr) and iron oxide, or an inorganic film made with MoSi, ZrSiO, SiN, and/or TiN.

During an exposure process with the immersion lithography system 100, the immersion fluid may be held inside the space 140 between the lens system 120 and the substrate 112 by a water control feature. The imaging layer 116 may leach various chemicals and/or introduce particles (e.g., peeling defect from resist film) into the immersion fluid. Additionally, other particles from the substrate 112 and/or system 100 may also be introduced into the immersion fluid. Following the exposure process, the substrate table 110 may be moved 150 to perform another exposure process at a next location on the substrate 112.

An area 160 of the immersion fluid retaining module 130 that was previously wet from contact with the immersion fluid may now be partly dry. However, the surface area 160 may retain water drops from the immersion fluid. Some of these water drops may contain chemicals and/or particles that were previously introduced into the immersion fluid and may become particle stains 162 that may adhere to the area 160 when the water drop evaporates. Another area 170 of the immersion fluid retaining module 130 (on the opposite side of the lens system 120) that was previously dry may now be wet from contact with the immersion fluid. Particle stains 172 (that were previously formed from evaporated dirty water drops) on this area 170 may trap additional dirty water drops and may become larger when the water drops evaporate again. This type of particle stain formation may be most prevalent at the wet/dry interface areas of the system 100 and may repeat itself as the substrate table 110 is moved to process the entire substrate 112. Eventually, these particle stains 162, 172 may become large enough and peel or lift off 180 during processing. Additionally, other stains 190 may be generated by water drops (or watermarks) that are left behind from a tailing effect of the immersion fluid as the substrate table 110 is moved during processing. It has been observed that the number of water drops left behind may be greatest when a receding contact angle 195 is small. These various stains 162, 172, 190 may result in real defects on the substrate 112 and thus, may lead to low yield.

Figure 2:
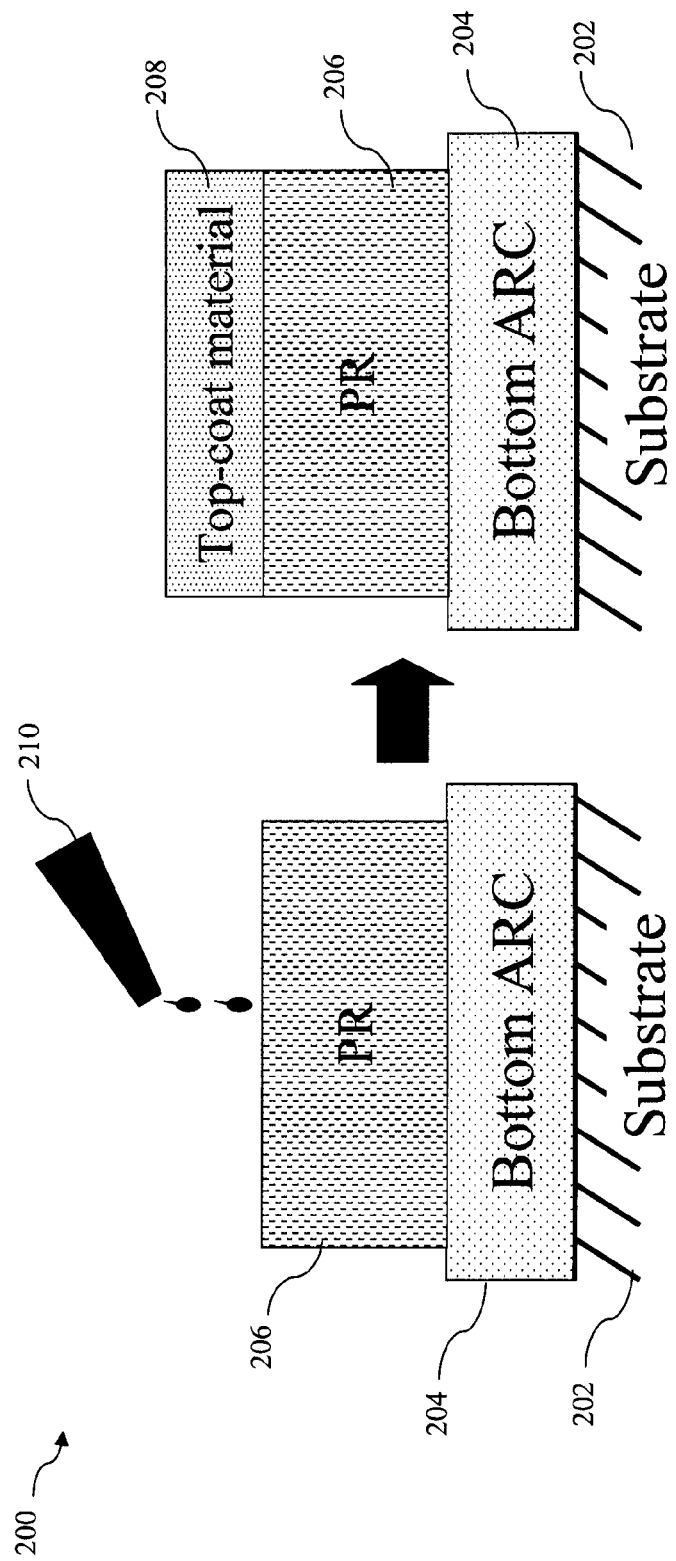
FIG. 2 is a cross-sectional view of a partial semiconductor device including a topcoat layer formed over a photosensitive layer.

Referring now to FIG. 2, illustrated is a cross-sectional view of a partial semiconductor device 200 including a topcoat layer formed on a photosensitive layer. The device 200 may comprise a semiconductor substrate 202 similar to the one discussed in FIG. 1. The device 200 may further comprise a bottom anti-reflective coating (ARC) layer 204 formed over the substrate 202. The bottom ARC layer 204 may be formed over the substrate 202 by a variety of techniques, including but not limited to spin-on coating, PVD, CVD, and/or other processes. The bottom ARC layer 204 may include organic or inorganic materials. In one embodiment, the bottom ARC layer 204 may include one or more materials, such as TiN, silicon oxynitride, silicon nitride and/or any suitable materials.

The device 200 may further comprise a photosensitive layer 206 formed over the bottom ARC layer 204. The photosensitive layer 206 may include a photoresist layer (resist layer, imaging layer, patterning layer) that is responsive to an exposure process for creating patterns. The photosensitive layer 206 may be a positive or negative type resist material and may have a multi-layer structure. One exemplary resist material is a chemical amplifier (CA) resist.

One method to reduce defects such as water stains and particles generated from the photosensitive layer 206 is to provide a topcoat layer 208. The topcoat layer 208 may be formed over the photosensitive layer 206 by a spin coating process 210. The topcoat layer 208 may serve as a protector to prevent diffusion or leaching of photoresist material into the immersion fluid during processing. Additionally, the topcoat layer 208 may reduce the propensity of leaving behind water drops (or watermarks) due to its hydrophobicity and physical properties. However, there are several disadvantages of utilizing the topcoat layer, such as increased costs, decreased throughput, and/or adverse affects on the lithography process.

Figure 3:
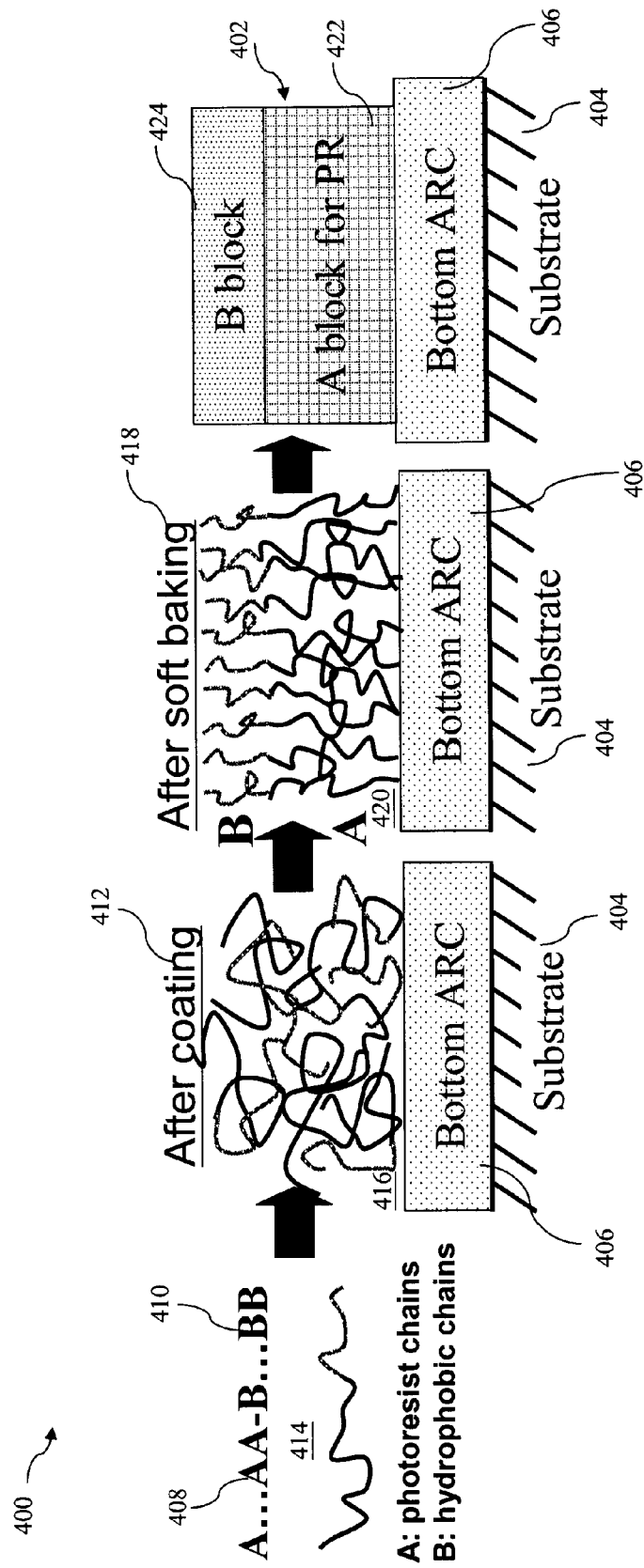
FIG. 3 is a cross-sectional view of a partial semiconductor device including formation of a self-assembled photosensitive layer according to one embodiment of the present disclosure.

Referring now to FIG. 3, illustrated is a cross-sectional view of a partial semiconductor device 400 including formation of a self-assembled photosensitive layer 402 for use in photolithography. The device 400 may comprise a substrate 404 and a bottom ARC layer 406 that may be similar to the ones discussed in FIGS. 1-2. The self-assembled photosensitive layer 402 may include a copolymer comprising a photoresist chain 408 and at least one functional homopolymer chain attached at the end of the photoresist chain. For example, the photoresist chain 408 may include a resin as shown below. The at least one functional homopolymer chain may comprise a hydrophobic chain 410 having a functional group (X) that includes OH, Cl, $CF_3$, or $CH_3$, as shown below. Alternatively, the functional group (X) may also include an aliphatic group.

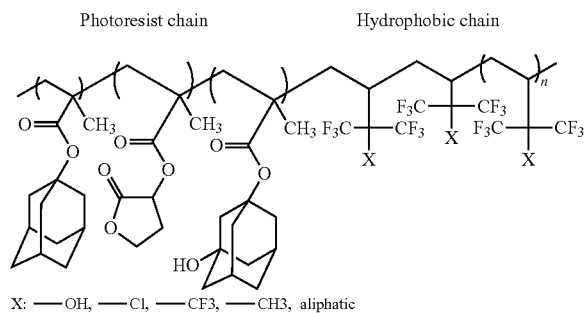

It is understood that the number of photoresist chains and hydrophobic chains may vary depending on a particular application.

The self-assembled photosensitive layer 402 may be formed over the bottom ARC layer 406 by a spin coating process 412 or other suitable process. For example, a photosensitive material solution 414 containing the photoresist chains 408 and the hydrophobic chains 410 may be dispensed onto the surface of the bottom ARC layer 406, and the substrate 404 may be spun rapidly until an uniform film 416 is formed. The thickness of the film 416 may vary depending on the particular application. Following the spin coating process 412, the photoresist chains 408 and hydrophobic chains 410 of the film 416 may be randomly oriented and entangled with each other. A soft bake process 418 (also refereed to as pre-bake process) may then be performed to remove solvents from the film 416. Additionally, the soft bake process 418 may promote self-assembly of a multi-layer structure 420 where the photoresist chains 408 form a bottom photoresist layer 422 (A block) and the hydrophobic chains 410 form a top hydrophobic layer 424 (B block). Furthermore, the soft bake process 418 may promote orientation of the photoresist chains 408 and hydrophobic chains 410 in a partially vertical direction with respect to the surface of the substrate 404 such that entanglement of the chains 408, 410 may be greatly reduced. By adjusting the temperature and time of the soft bake process, the degree of phase separation and chain orientation can be controlled. Accordingly, the bottom photoresist layer 422 and the top hydrophobic layer 424 make up the self-assembled photosensitive layer 402.

The top hydrophobic layer 424 may provide protection and prevent leaching of the bottom photoresist layer 422 into the immersion fluid during processing. The thickness of the top hydrophobic layer 424 may be tunable by adjusting the molecular weight of the hydrophobic chain 410. Additionally, the hydrophobicity of the top hydrophobic layer 424 may be tunable by changing the functional group (X) of the hydrophobic chain 410. Furthermore, the top hydrophobic layer 424 may provide a surface hard coating as well as provide a top coating material for surface hydrophobic/hydrophilic characteristics. This hydrophobic surface will decrease the number of water drops (or watermarks) that may be left behind during processing. The self-assembled photosensitive layer 402 may now be patterned by using a lithography system.

Figures 4A, 4B:
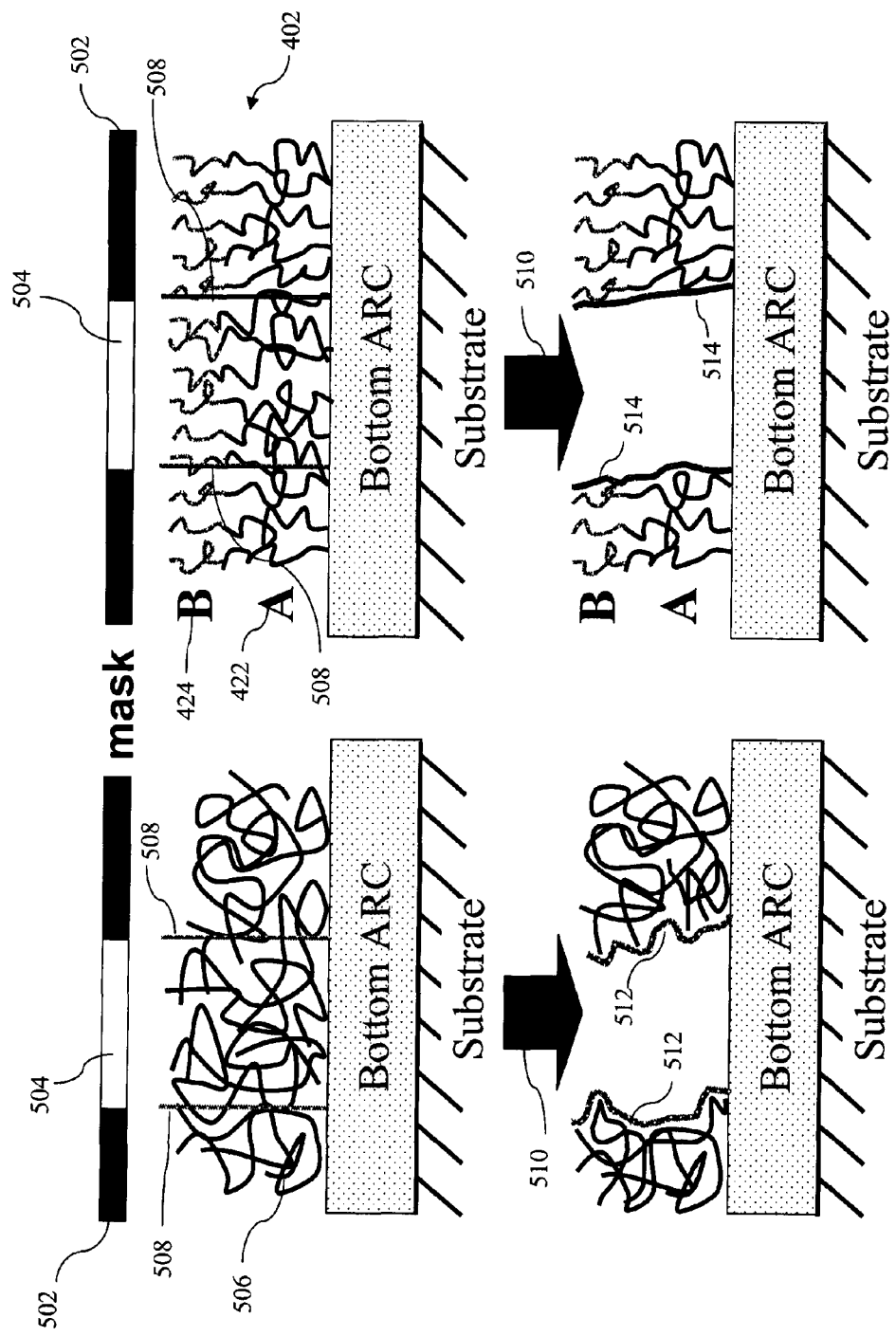
FIGS. 4A & 4B are cross-sectional views of an exposure and development process utilizing a conventional photosensitive layer as compared to utilizing the self-assembled photosensitive layer of FIG. 3.

Referring now to FIGS. 4A and 4B, illustrated are cross-sectional views of an exposure and development process utilizing a conventional photosensitive layer (FIG. 5A) as compared to utilizing the self-assembled photosensitive layer of FIG. 3 (FIG. 5B). Similar features in FIGS. 4A and 4B are numbered the same for simplicity and clarity. As previously discussed, a photomask or mask 502 (also referred to as a reticle) may be used to pattern the photosensitive layer with a lithography system such as the immersion lithography system of FIG. 1. During an exposure process, light radiation from the lithography system (not shown) may pass through areas 504 of the mask 502 that are transparent so that a pattern on the mask may be transferred to the photosensitive layer.

In FIG. 4A, the photosensitive layer may include a conventional photoresist layer 506 comprising a plurality of photoresist chains that are randomly orientated and entangled with each other. The light radiation may expose an area 508 of the photoresist layer 506. Following the exposure process, the photoresist layer 506 may be developed 510 using a chemical developer. The chemical developer may dissolve the exposed area 508 of the photoresist layer 506 leaving behind only the unexposed areas of the photoresist layer. However, a line profile 512 of the dissolved area may not be as vertical as desired due to the random orientation and entanglement of the photoresist chains. This may be referred to as a line edge roughness (LER) which can lead to defective resist patterns and thus, may cause yield degradation and poor device performance.

In FIG. 4B, the photosensitive layer may include the self-assembled photosensitive layer 402 of FIG. 3. As previously discussed, the self-assembled photosensitive layer 402 may include a bottom photoresist layer 422 (A block) and a top hydrophobic layer 424 (B block). The photoresist chains 408 that make up the bottom photoresist layer 422 and the hydrophobic chains 410 that make up the top hydrophobic layer 424 may be oriented in a vertical direction and may be less entangled following the soft bake process. The self-assembled photosensitive layer 402 may be patterned by an exposure and development process as discussed above. However, a line profile 514 of a developed area in the present example may be improved as compared to the line profile of FIG. 4A due to the vertical orientation and reduced entanglement of the chains of the bottom photoresist layer 422 and the top hydrophobic layer 424. Accordingly, the line edge roughness (LER) may be reduced and thus, this may lead to increased yield and improved device performance and reliability.

Figure 5:
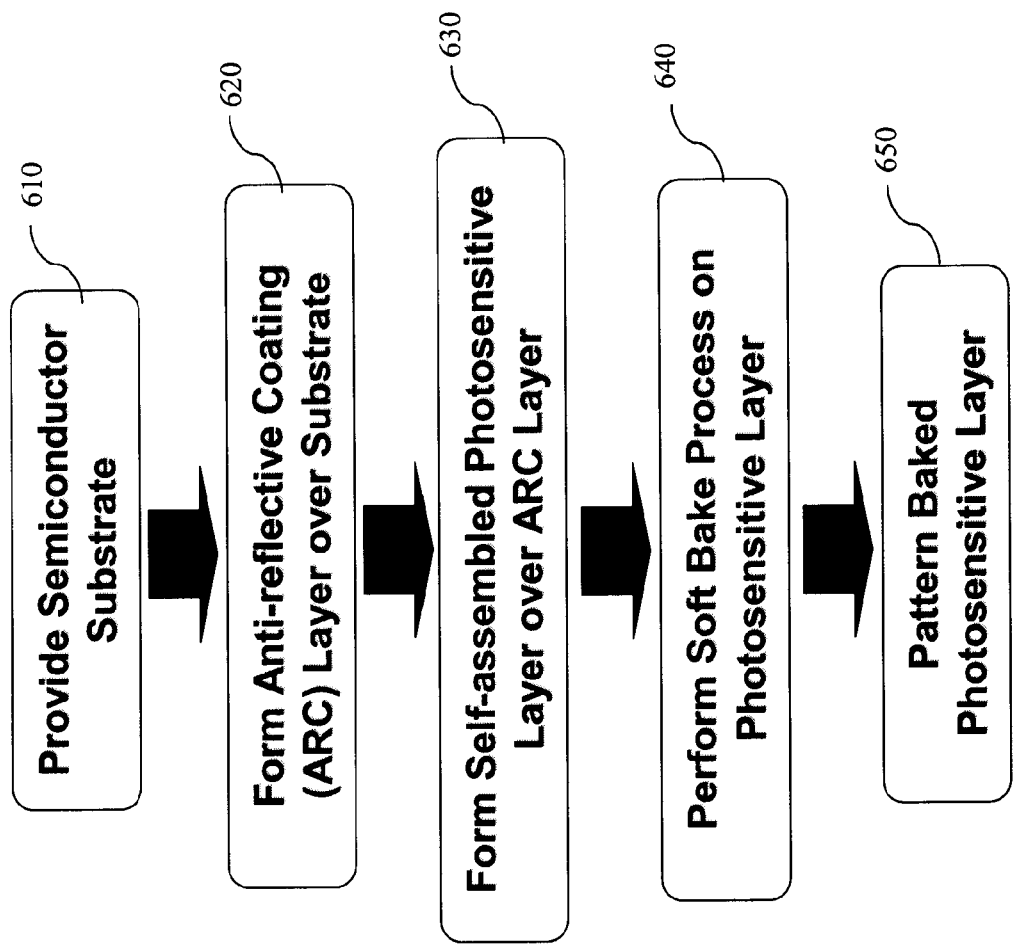
FIG. 5 is a flow chart illustrating a method of making a partial semiconductor device having the self-assembled photosensitive layer of FIG. 3.

Referring now to FIG. 5, illustrated is a flow chart of a method 600 for making a partial semiconductor device including the self-assembled photosensitive layer of FIG. 3. The method 600 begins with step 610 in which a semiconductor substrate may be provided. The semiconductor substrate may be similar to the one discussed in FIG. 1. The method 600 continues with step 620 in which an anti-reflective coating (ARC) layer may be formed over the semiconductor substrate. The ARC layer may be similar to the one discussed in FIG. 2. The method 600 continues with step 630 in which a self-assembled photosensitive layer may be formed over the ARC layer. The self-assembled photosensitive layer may comprise photoresist chains and hydrophobic chains as was discussed in FIG. 3. The method 600 continues with step 640 in which a soft bake process may be performed on the self-assembled photosensitive layer to form a bottom photoresist layer and a top hydrophobic layer. Additionally, the soft bake process may promote vertical orientation of the photoresist and hydrophobic chains that make up the bottom photoresist layer and top hydrophobic layer, respectively, and may reduce entanglement of these chains. The method 600 continues with step 650 in which the baked self-assembled photosensitive layer may be patterned by an exposure process using a lithography system such as an immersion lithography system of FIG. 1.

It is understood that other lithography processes, such as a post bake and hard bake process, may be implemented in the above examples. Since those additional steps are known in the art, they are not be described herein for simplicity and clarity. Although only a few exemplary embodiments of this disclosure have been described in details above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. Accordingly, all such modifications are intended to be included within the scope of this disclosure.

Thus, the present disclosure provides a photosensitive material for use in semiconductor manufacture. The photosensitive material comprises a copolymer that includes a plurality of photoresist chains and a plurality of hydrophobic chains, each of the hydrophobic chains is attached to one of the photoresist chains. The copolymer in response to externally applied energy will self-assemble to a photoresist layer and a hydrophobic layer. In some other embodiments, each hydrophobic chain includes at least one functional group selected from the group consisting of: OH, Cl, $CF_3$, and $CH_3$. In other embodiments, a hydrophobicity of the hydrophobic layer is tunable by the selection of the at least one functional group. In still other embodiments, each hydrophobic chain includes an aliphatic group.

In other embodiments, a thickness of the hydrophobic layer is tunable by a molecular weight of the hydrophobic chain. In some embodiments, the hydrophobic layer is a hard surface coating. In some other embodiments, an orientation of the plurality of photoresist chains and the plurality of hydrophobic chains in response to externally applied energy will be partially vertical relative to a surface of a substrate. The surface of the substrate has been coated with the copolymer. In some other embodiments, the hydrophobic layer overlies the photoresist layer.

Also provided is a method including the steps of providing a semiconductor substrate; forming an anti-reflective coating (ARC) layer over the semiconductor substrate; forming a photosensitive layer over the ARC layer; and performing a lithography process to the photosensitive layer so that the photosensitive layer self-assembles into a photoresist layer and a hydrophobic layer. In some embodiments, the step of forming the photosensitive layer includes spin coating a copolymer having a photoresist chain and a hydrophobic chain attached to the end of the photoresist chain. In other embodiments, the step of performing the lithography process includes performing a soft bake process to the photosensitive layer. In some other embodiments, the step of performing the lithography process includes inducing a partial vertical orientation of the photoresist chain and the hydrophobic chain relative to the surface of the semiconductor substrate.

In still other embodiments, the step of performing the lithography process includes adjusting a baking temperature and time period to control a degree of phase separation and orientation of the chains. In some embodiments, the method further includes exposing the photoresist layer and hydrophobic layer with light radiation to form a pattern. In some other embodiments, the step of exposing includes exposing the photoresist layer and hydrophobic layer by immersion lithography.

Additionally, a resist material for use in photolithography patterning includes a photoresist chain and at least one functional hydrophobic chain attached at the end of the photoresist chain. The photoresist chain and the at least one functional hydrophobic chain being responsive to applied energy for self-assembling to a multi-layer structure. In some embodiments, the multi-layer structure includes a photoresist layer and a hydrophobic layer. In some other embodiments, the at least one functional hydrophobic chain includes a functional group consisting of: OH, Cl, $CF_3$, and $CH_3$. In other embodiments, the at least one functional hydrophobic chain includes an aliphatic group. In still other embodiments, an orientation of the photoresist chain and the at least one functional hydrophobic chain becomes partially vertical relative to a surface on which the resist material is applied to.

Several different advantages exist with these and other embodiments. In addition to providing a simple and cost-effective method and device for reducing defects, such as watermarks and contaminations, in immersion lithography, the method and device disclosed here also improves a line edge roughness (LER) of the patterned photoresist for better critical dimension control and greater wafer yield. Additionally, the method and device disclosed herein improves throughput since one coating and baking process is need to form a photosensitive layer having both a bottom photoresist layer and a top hydrophobic layer. Accordingly, the method and device provides a multi-functional photosensitive layer including a photoresist material, a top coating material, and a vertically orientated material.

What is claimed is:

1. A method, comprising:
providing a semiconductor substrate;
forming an anti-reflective coating (ARC) layer over the semiconductor substrate;
forming a combination photosensitive layer over the ARC layer by spin coating a copolymer having a photoresist chain having a structure of

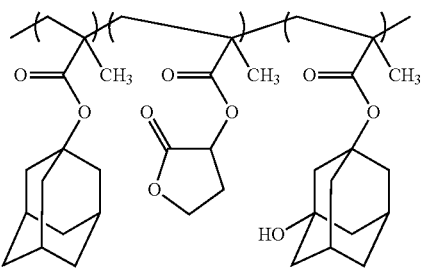

and a hydrophobic chain attached to an end of the photoresist chain, the hydrophobic chain including at least one functional group and having the

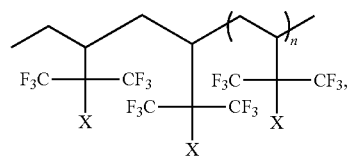

structure, X representing the at least one functional group, wherein the combination photosensitive layer includes material to produce a hydrophobic layer; and
performing a lithography process to the combination photosensitive layer so that the combination photosensitive layer self-assembles into a photoresist layer and the hydrophobic layer overlying the photoresist layer.

2. The method of claim 1, wherein the step of performing the lithography process includes performing a soft bake process to the combination photosensitive layer.

3. The method of claim 2, wherein the step of performing the lithography process includes inducing a partial vertical orientation of the photoresist chain and the hydrophobic chain relative to the surface of the semiconductor substrate.

4. The method of claim 2, wherein the step of performing the lithography process includes adjusting a baking temperature and time period to control a degree of phase separation and orientation of the chains.

5. The method of claim 1, further comprising exposing the photoresist layer and hydrophobic layer with light radiation to form a pattern.

6. The method of claim 5, wherein the step of exposing includes exposing the photoresist layer and hydrophobic layer by immersion lithography.

7. The method of claim 1, wherein the at least one functional group is selected from the group consisting of: OH, Cl, $CF_3$, and $CH_3$.

8. A method of forming a photoresist material, comprising:
spin coating a copolymer having a plurality of photoresist chains having a structure of

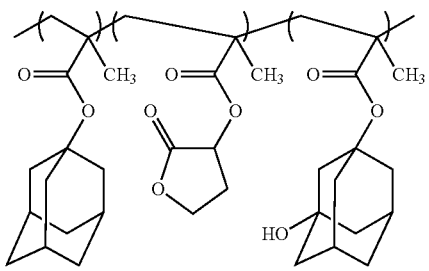

and a plurality of hydrophobic chains attached to an end of the photoresist chains over a substrate, wherein the hydrophobic chains include at least one functional group X, and have the structure;

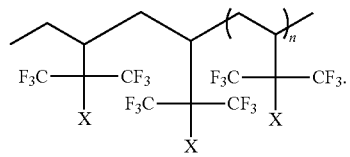

and
performing a lithography process on the copolymer so that the photoresist chains and the hydrophobic chains self-assemble into a hydrophobic layer overlying a photoresist layer.

9. The method of claim 8, further comprising:
forming an anti-reflective coating (ARC) layer over the substrate, wherein the copolymer is spin-coated onto the ARC layer.

10. The method of claim 8, wherein the step of performing the lithography process includes performing a soft bake process on the copolymer.

11. The method of claim 10, wherein the step of performing the lithography process includes inducing a partial vertical orientation of the photoresist chains and the hydrophobic chains relative to the surface of the substrate.

12. The method of claim 10, wherein the step of performing the lithography process includes adjusting a baking temperature and time period to control a degree of phase separation and orientation of the chains.

13. The method of claim 8, further comprising exposing the photoresist layer and hydrophobic layer with light radiation to form a pattern.

14. The method of claim 13, wherein the step of exposing includes exposing the photoresist layer and hydrophobic layer by immersion lithography.

15. The method of claim 8, wherein the least one functional group X is selected from the group consisting of OH, Cl, CF3, and CH3.

16. A method of forming a photoresist material, comprising:
spin coating a copolymer having a plurality of photoresist chains having a structure of

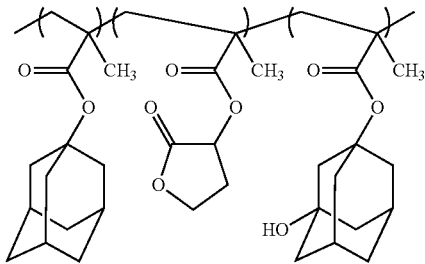

and a plurality of hydrophobic chains attached to an end of the photoresist chains over a substrate, the hydrophobic chains including at least one functional group X selected from the group consisting of: OH, Cl, CF3, and CH3, and having the structure

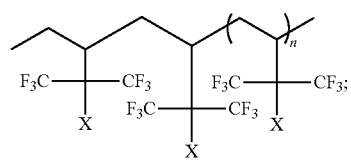

and
performing a soft bake process on the copolymer so that the photoresist chains and the hydrophobic chains self-assemble into a hydrophobic layer overlying a photoresist layer.

17. The method of claim 16, further comprising:
forming an anti-reflective coating (ARC) layer over the substrate, wherein the copolymer is spin-coated onto the ARC layer.

18. The method of claim 16, further comprising exposing the photoresist layer and hydrophobic layer with light radiation to form a pattern.

* * * * *